United States Patent
Kim et al.

(10) Patent No.: US 8,936,737 B2
(45) Date of Patent: Jan. 20, 2015

(54) CONDUCTIVE PASTE FOR INTERNAL ELECTRODES, MULTILAYER CERAMIC ELECTRONIC COMPONENT USING THE SAME, AND METHOD OF MANUFACTURING THE SAME

(71) Applicant: Samsung Electro-Mechanics Co., Ltd., Gyunggi-do (KR)

(72) Inventors: Hyo Sub Kim, Gyunggi-do (KR); Jeong Ryeol Kim, Gyunggi-do (KR); Chang Hoon Kim, Gyunggi-do (KR); Gun Woo Kim, Gyunggi-do (KR); Doo Young Kim, Gyunggi-Do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 251 days.

(21) Appl. No.: 13/670,970

(22) Filed: Nov. 7, 2012

(65) Prior Publication Data

US 2014/0054514 A1    Feb. 27, 2014

(30) Foreign Application Priority Data

Aug. 22, 2012  (KR) .......................... 10-2012-0091667

(51) Int. Cl.
| | | |
|---|---|---|
| *H01B 1/16* | (2006.01) | |
| *H01B 1/22* | (2006.01) | |
| *B05D 5/12* | (2006.01) | |
| *H01B 1/02* | (2006.01) | |
| *H01G 4/008* | (2006.01) | |
| *H01C 10/00* | (2006.01) | |
| *H02N 2/00* | (2006.01) | |
| *B82Y 30/00* | (2011.01) | |
| *C09D 11/52* | (2014.01) | |
| *H01L 41/047* | (2006.01) | |
| *H01L 41/273* | (2013.01) | |
| *H01G 4/30* | (2006.01) | |
| *H01F 17/00* | (2006.01) | |
| *H01G 4/12* | (2006.01) | |

(52) U.S. Cl.
CPC ................. *H01B 1/02* (2013.01); *H01G 4/008* (2013.01); *H01C 10/00* (2013.01); *H02N 2/00* (2013.01); *B82Y 30/00* (2013.01); *C09D 11/52* (2013.01); *H01B 1/22* (2013.01); *H01L 41/0471* (2013.01); *H01L 41/0477* (2013.01); *H01L 41/273* (2013.01); *H01G 4/30* (2013.01); *H01G 4/0085* (2013.01); *H01F 17/0013* (2013.01); *Y10S 977/773* (2013.01); *Y10S 977/81* (2013.01); *Y10S 977/811* (2013.01); *H01G 4/12* (2013.01)
USPC ............. 252/513; 427/58; 977/773; 977/810; 977/811

(58) Field of Classification Search
CPC ........ H01B 1/16; H01B 1/22; H01L 31/0264; H01L 31/0471; H01L 31/0477; H01L 23/4828; H01L 2924/09701; C03C 8/18; H05K 1/092; H05K 3/4629; B05D 5/12
USPC ........................................... 252/513; 427/58
See application file for complete search history.

(56) References Cited

U.S. PATENT DOCUMENTS

| 4,816,749 A * | 3/1989 | Schmidtpott et al. ........ 324/71.1 |
| 4,863,683 A * | 9/1989 | Nakatani et al. ................. 419/10 |
| 2007/0018776 A1 * | 1/2007 | Tanaka et al. ............... 338/22 R |

FOREIGN PATENT DOCUMENTS

| JP | 08-144065 A * | 6/1996 |
| JP | 2004-330247 A | 11/2004 |
| JP | 2011-082000 A | 4/2011 |

*Primary Examiner* — Mark Kopec
(74) *Attorney, Agent, or Firm* — McDermott Will & Emery LLP

(57) ABSTRACT

There are provided a conductive paste for internal electrodes, a multilayer ceramic electronic component including the same, and a method of manufacturing the same. The conductive paste for internal electrodes including: a nickel (Ni) powder; a nickel oxide (NiO) powder having a content of 5.0 to 15.0 parts by weight based on 100 parts by weight of the nickel powder; and an organic vehicle.

12 Claims, 3 Drawing Sheets

A-A'

CONDUCTIVE PASTE FOR INTERNAL ELECTRODES, MULTILAYER CERAMIC ELECTRONIC COMPONENT USING THE SAME, AND METHOD OF MANUFACTURING THE SAME

CROSS-REFERENCE TO RELATED APPLICATIONS

This application claims the priority of Korean Patent Application No. 10-2012-0091667 filed on Aug. 22, 2012, in the Korean Intellectual Property Office, the disclosure of which is incorporated herein by reference.

BACKGROUND OF THE INVENTION

1. Field of the Invention

The present invention relates to a conductive paste for internal electrodes, a multilayer ceramic electronic component using the same, and a method of manufacturing the same.

2. Description of the Related Art

As electronic components using a ceramic material, there may be provided a capacitor, an inductor, a piezoelectric element, a varistor, a thermistor, and the like.

Among these, a multilayer ceramic capacitor (MLCC), a condenser having a chip shape, has advantages such as compactness, high capacitance, and ease of mounting, and may be easily installed in printed circuit boards of various electronic products such as personal digital assistants (PDAs), cellular phones, and the like, to perform an important role in charging electricity therein and discharging electricity therefrom. MLCCs have various sizes and stack structures according to intended use and desired capacitance thereof.

Recently, in accordance with the trend for small, slimmed electronic products, a multilayer ceramic capacitor, an essential passive component in electronic products, has also been required to have a subminiaturized size and super high capacitance.

Therefore, a multilayer ceramic capacitor in which a dielectric layer and internal electrodes are thinned for the subminiaturized size, and increasing amounts of dielectric layers and internal electrode layers have been stacked in order to realize super high capacitance has been manufactured.

In the multilayer ceramic capacitor, barium titanate (BaTiO$_3$) is generally used as a material for dielectric layers, and nickel is commonly used as a material for internal electrodes. Here, it is necessary to use particulate barium titanate and particulate nickel powder having high crystallinity for a product having a subminiaturized size and high capacitance.

The multilayer ceramic capacitor may be manufactured by stacking layers of internal electrode formed on ceramic sheets and performing a co-firing process at a temperature of 1000° C. to 1200° C. for densification of the ceramic sheets. However, a particulate nickel powder may be over-fired, resulting in particle-growth, such that the thickness of the internal electrode may be increased, causing a limitation in producing a small, slimmed product. In addition, since a large gap may be formed between the internal electrodes to cause a disconnection phenomenon in which the internal electrodes are disconnected from each other, internal electrode connectivity may be deteriorated, and capacitance may be decreased.

In addition, a nickel powder particle may have a large surface area, high activity, and a significantly low sintering initiation temperature. In particular, in the case of performing the sintering process under a non-oxidation atmosphere in order to prevent the oxidation of nickel, the internal electrode formed of nickel is initially sintered and shrunk at a low temperature of 400° C. or less; however, the ceramic sheet having a relatively higher sintering temperature is not sintered and shrunk.

Therefore, at the time of the sintering process, shrinkage behaviors of the ceramic sheet and the internal electrode may be different, to thereby generate a relatively large amount of stress in the multilayer ceramic capacitor, such that structural defects such as delamination, cracking, and the like, may be generated in products, leading to deteriorated productivity in a multilayer ceramic capacitor manufacturing process.

In order to solve the problem, nickel powder particle surfaces may be coated with an oxide.

However, in this case, the oxide may react with the ceramic of the dielectric layer to obtain an additional effect in changing ceramic characteristics. In addition, when a coating layer is formed around the nickel particles which are not completely dispersed but are agglomerated, since shrinkage is initiated in the nickel particle present in the coating layer at an original low temperature, the coating layer may be destroyed and the sintering process may rapidly progress, such that the oxide may be extruded to the outside of a sintered body. As a result, an effect of suppressing the sintering of the nickel may not be sufficiently obtained.

SUMMARY OF THE INVENTION

An aspect of the present invention provides a conductive paste for internal electrodes for manufacturing a multilayer ceramic electronic component having excellent reliability, a multilayer ceramic electronic component using the same, and a method of manufacturing the same.

According to an aspect of the present invention, there is provided a conductive paste for internal electrodes including: a nickel (Ni) powder; a nickel oxide (NiO) powder having a content of 5.0 to 15.0 parts by weight based on 100 parts by weight of the nickel powder; and an organic vehicle.

The nickel powder may have an average particle size of 80 nm to 200 nm.

The nickel oxide powder may have an average particle size of 10 nm to 50 nm.

The organic vehicle may include an ethyl cellulose-based binder and terpineol.

According to another aspect of the present invention, there is provided a multilayer ceramic electronic component including: a ceramic body in which a plurality of dielectric layers are stacked; and a plurality of internal electrodes formed on at least one surfaces of the plurality of dielectric layers, wherein the plurality of internal electrodes are formed of a conductive paste including a nickel (Ni) powder, a nickel oxide (NiO) powder having a content of 5.0 to 15.0 parts by weight based on 100 parts by weight of the nickel powder, and an organic vehicle.

A shrinkage initiation temperature of the internal electrodes may be lower than that of the ceramic body, and the shrinkage initiation temperature may be 700° C. or above.

The multilayer ceramic electronic component may further include external electrodes formed on both end surfaces of the ceramic body and electrically connected to the internal electrodes.

According to another aspect of the present invention, there is provided a method of manufacturing a multilayer ceramic electronic component, the method including: forming first and second internal electrodes by applying a conductive paste including a nickel (Ni) powder, a nickel oxide (NiO) powder having a content of 5.0 to 15.0 parts by weight based on 100 parts by weight of the nickel powder, and an organic vehicle to at least one surfaces of first and second ceramic sheets, so as to be exposed through both end surfaces of the first and second ceramic sheets, respectively; forming a laminate by alternately stacking the plurality of first and second ceramic sheets having the first and second internal electrodes formed thereon; forming a ceramic body by sintering the laminate; and forming first and second external electrodes on both end surfaces of the ceramic body so as to cover surfaces on which the first and second internal electrodes are exposed.

In the forming of the first and second internal electrodes, the first and second internal electrodes may be alternately exposed through both end surfaces of the laminate when the first and second ceramic sheets are alternately stacked.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
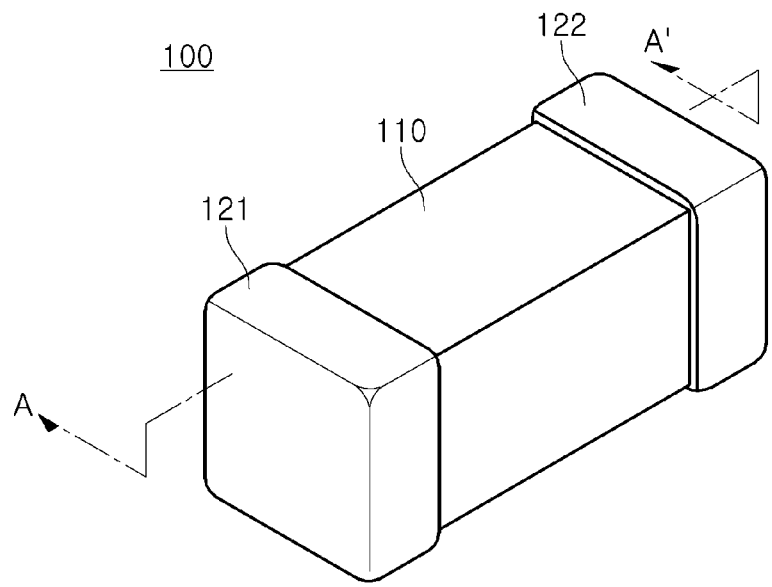
FIG. 1 is a perspective view schematically showing a multilayer ceramic capacitor according to an embodiment of the present invention.

Embodiments of the present invention will now be described in detail with reference to the accompanying drawings.

The embodiments of the present invention may be modified in many different forms and the scope of the invention should not be limited to the embodiments set forth herein. Rather, these embodiments are provided so that this disclosure will be thorough and complete, and will fully convey the concept of the invention to those skilled in the art.

In the drawings, the shapes, dimensions, or the like, of elements may be exaggerated for clarity.

The present invention relates to a multilayer ceramic electronic component. An example of the multilayer ceramic electronic component according to an embodiment of the present invention includes a multilayer ceramic capacitor, an inductor, a piezoelectric element, a varistor, a chip resistor, a thermistor, and the like. Hereinafter, a multilayer ceramic capacitor is described as an example of the multilayer ceramic electronic component.

Figure 2:
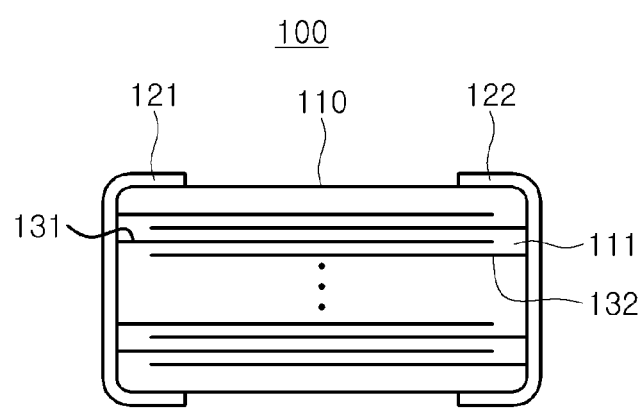
FIG. 2 is a cross-sectional view taken along line A-A' of FIG. 1.

Referring to FIGS. 1 and 2, a multilayer ceramic capacitor 100 according to the present embodiment may include a ceramic body 110 in which a plurality of dielectric layers 111 are stacked; and a plurality of first and second internal electrodes 131 and 132 formed on at least one surfaces of the plurality of dielectric layers 111.

Here, first and second external electrodes 121 and 122 may be formed on both end surfaces of the ceramic body 110 to be electrically connected to the first and second internal electrodes 131 and 132.

The ceramic body 110 may generally have a rectangular parallelepiped shape, but is not specifically limited thereto.

In addition, the ceramic body 110 is not specifically limited in dimensions. For example, the ceramic body 110 may have a size of 0.6 mm×0.3 mm, or the like, to allow a multilayer ceramic capacitor having high capacitance of 1.0 µF or more, and more preferably, 22.5 µF or more to be manufactured.

The ceramic body 110 may include a dielectric cover layer (not shown) having a predetermined thickness formed on an upper surface and a lower surface thereof in a lamination direction.

A thickness of a single dielectric layer 111 contributing to forming capacitance within the capacitor may be appropriately changed according to a desired level of capacitance in the multilayer ceramic capacitor.

In the present embodiment, a thickness of a single dielectric layer 111 after a firing process may be set to be 1.0 µm or less, and more particularly, 0.01 to 1.0 µm; however, the present invention is not limited thereto.

The dielectric layer 111 may include a ceramic powder, for example, a $BaTiO_3$-based ceramic powder, or the like. However, the present invention is not limited thereto.

An example of the $BaTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$, or the like, having Ca, Zr, or the like, introduced in $BaTiO_3$, but is not limited thereto.

The ceramic powder may have an average particle of 200 nm or less, and more preferably, 80 nm to 100 nm, but the present invention is not limited thereto.

In addition to the ceramic powder, a transition metal oxide or carbide, a rare-earth element, a ceramic additive such as Mg, Al, or the like, an organic solvent, a plasticizer, a binder, a dispersant, or the like, may be selectively added to the dielectric layer 111.

The internal electrodes 131 and 132 may be printed on each ceramic sheet forming the dielectric layer 111 by a screen printing method, a gravure printing method, or the like.

Here, the internal electrodes 131 and 132 may be formed in the ceramic body 111 having the dielectric layer 111 interposed therebetween, through stacking and sintering processes.

In addition, the internal electrodes 131 and 132 may be formed as a pair of a first internal electrode 131 and a second internal electrode 132 having different polarities, and in this case, the first internal electrode 131 and the second internal electrode 132 may be disposed to face each other in a lamination direction, having the dielectric layer 111 interposed therebetween.

The thickness of the internal electrodes 131 and 132 may be appropriately determined according to use thereof, or the like, for example, may be 1.0 µm or less, and more preferably, may be selected within the range of 0.01 to 1.0 µm.

The internal electrodes 131 and 132 may be formed of a conductive paste including a nickel (Ni) powder, and the conductive paste may include a nickel oxide powder having a content of 5.0 to 15.0 parts by weight based on 100 parts by weight of nickel powder, and an organic vehicle.

Therefore, the nickel oxide powder and the organic vehicle are included in the conductive paste, thereby increasing a shrinkage initiation temperature of the internal electrodes 131 and 132. Here, the shrinkage initiation temperature of the internal electrodes 131 and 132 may preferably be lower than that of the ceramic body 110, and the minimum value thereof may more preferably be 700° C. or more.

Figure 3:
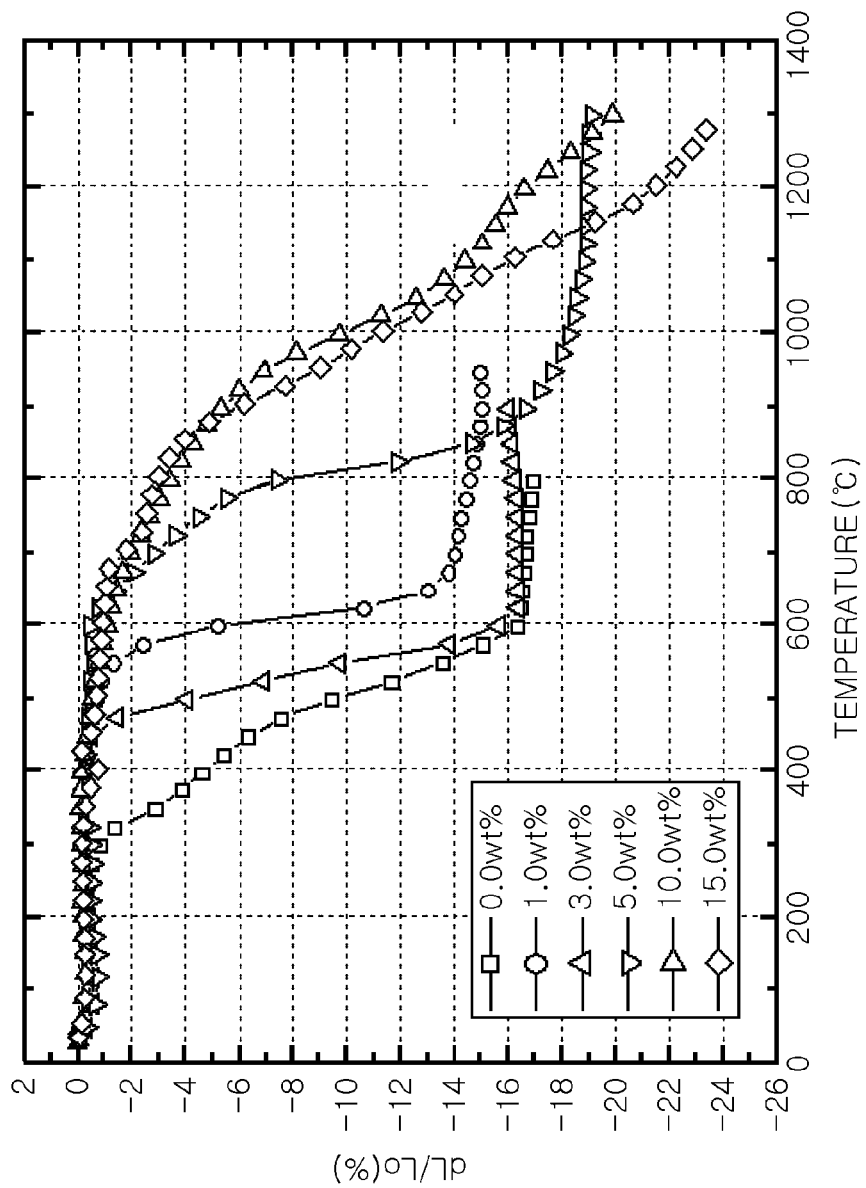
FIG. 3 is a graph showing shrinkage behavior of a conductive paste according to a content of nickel oxide.

Referring to FIG. 3, it may be appreciated that as an added amount of nickel oxide is increased, the shrinkage initiation temperature is also increased.

The reason that the shrinkage initiation temperature of the conductive paste is increased is as follows. As the temperature is increased, the nickel particles may be connected to each other and be grown in order to decrease a large specific surface area thereof. During the growth of the nickel particles, the nickel oxide added when the nickel particles are grown to be connected to adjacent nickel particles may be present between the nickel particles to prevent the nickel particles from being grown, thereby decreasing the sintering initiation temperature.

Since a melting point of nickel is 1455° C. and a melting point of nickel oxide is 1955° C., about 500° C. higher than that of nickel, it is expected that the nickel oxide delays the shrinkage of nickel.

Meanwhile, the shrinkage initiation temperature according to a content of nickel oxide is increased as the added amount of nickel oxide is increased; however, an excessive amount of nickel oxide components may remain in a portion of the internal electrodes 131 and 132 after the sintering process and may be protruded from the internal electrodes 131 and 132 to the dielectric layer 111. Therefore, in the case in which the content of nickel oxide is excessive, breakdown voltage (BDV) may be decreased, and accordingly, there is a need to limit the amount thereof.

In addition, as the content of nickel oxide is increased, a change in volume in a reduction process increases, to thereby deteriorate electrode connectivity. Therefore, when the content of nickel oxide is 5.0 to 15.0 parts by weight, an effect of shrinkage delay is not sufficient, such that the desired amount of added nickel oxide may be 5.0 to 15.0 parts by weight at the time of analyzing the shrinkage behavior and the electrode connectivity.

The nickel powder included in the conductive paste may have an average particle size of 80 nm to 200 nm. In the case in which the average particle size of the nickel powder is less than 80 nm, it may be difficult to control the shrinkage at the time of the sintering process, and in the case in which the average particle size of the nickel powder is more than 200 nm, it may be difficult to allow the internal electrodes 131 and 132 to have a thin film shape.

In addition, the nickel oxide powder included in the conductive paste may have an average particle size of 10 to 50 nm.

In addition, the organic vehicle included in the conductive paste may be an ethyl cellulose-based binder, terpineol as a solvent, or the like. The ethyl cellulose-based binder may implement thixotropy, adhesion, and phase stability. Terpineol has a high viscosity as a solvent to thereby allow the conductive paste to be easily manufactured, and has a high boiling point to thereby slow a drying rate thereof. Therefore, terpineol may serve to be advantageous for a leveling process after printing the conductive paste.

Distal ends of the internal electrodes 131 and 132 as described above may be exposed through one end portion of the ceramic body 110. In the present embodiment, the distal ends of the first and second internal electrodes 131 and 132 in a length direction are shown to be alternately exposed to both opposing end surfaces of the ceramic body 110.

However, the present invention is not limited thereto. If necessary, the distal ends of the first and second internal electrodes 131 and 132 may be exposed through the same surface of the ceramic body 110, or may be exposed through two or more surfaces of the ceramic body 110, respectively, which may be changed in various structures.

The first and second external electrodes 121 and 122 may be formed on both end surfaces of the ceramic body 110. The first and second external electrodes 121 and 122 may be electrically connected to the distal ends of the first and second internal electrodes 131 and 132 exposed to at least one surface of the ceramic body 110, respectively.

A conductive material included in the first and second external electrodes 121 and 122 is not specifically limited. For example, a conductive paste formed of a noble metal material such as palladium (Pd), a palladium-silver (Pd—Ag) alloy, or the like, and at least one of nickel (Ni) and copper (Cu) may be used.

In addition, the thickness of the external electrodes 121 and 122 may be appropriately determined according to use thereof, or the like, may be 10 μm to 50 μm for example.

Hereinafter, an operation of the multilayer ceramic capacitor according to an embodiment of the present invention will be described.

In general, in the conductive paste for internal electrodes, as an average particle size of the nickel powder is decreased, a surface area of the nickel powder is squared to increase surface energy of the nickel powder, thereby lowering the shrinkage initiation temperature of the nickel powder.

Therefore, in the case of forming the internal electrodes 131 and 132 using the conductive paste including the particulate nickel powder, at the time of the sintering process in manufacturing the multilayer ceramic capacitor 100, the sintering initiation temperature of the internal electrodes 131 and 132 formed on the ceramic sheets is moved to a low temperature by an increased amount of the particulate material.

Accordingly, before the ceramic sheet is shrunk, the sintering process of the nickel powder included in the internal electrodes 131 and 132 is performed, such that delamination or cracking may be generated in the dielectric layer 111, overfiring may be performed on the internal electrodes 131 and 132. Therefore, since the metal components are agglomerated in an unevenly distributed state, the internal electrodes 131 and 132 may have a disconnection portion to thereby deteriorate the connectivity of the internal electrodes 131 and 132, and deteriorate the capacitance and reliability thereof.

As a method for solving the problem, a particulate barium titanate powder is added to the conductive paste for internal electrodes to thereby move the shrinkage initiation temperature of the nickel particles to a high temperature.

Figure 4A:
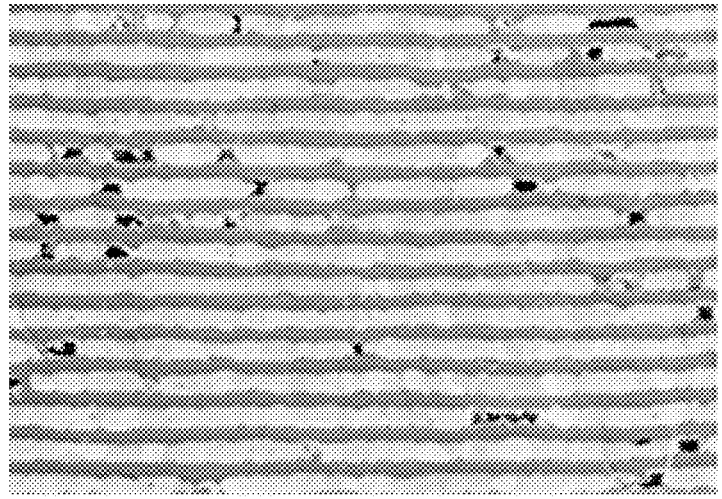
FIG. 4A is a scanning electron microscope (SEM) image showing a cross-section of an internal electrode formed of a conductive paste including barium titanate of the related art.

However, as shown in FIG. 4A, in the case in which the particulate barium titanate powder is added to the conductive paste for internal electrodes to form the internal electrodes, the cracking generated in the dielectric layer may be partially controlled; however, the added particulate barium titanate powder is permeated into the dielectric layer during the sintering process to accelerate growth of particles of barium titanate present in the dielectric layer. Therefore, breakdown voltage (BDV) may be decreased and reliability may also be deteriorated.

Figure 4B:
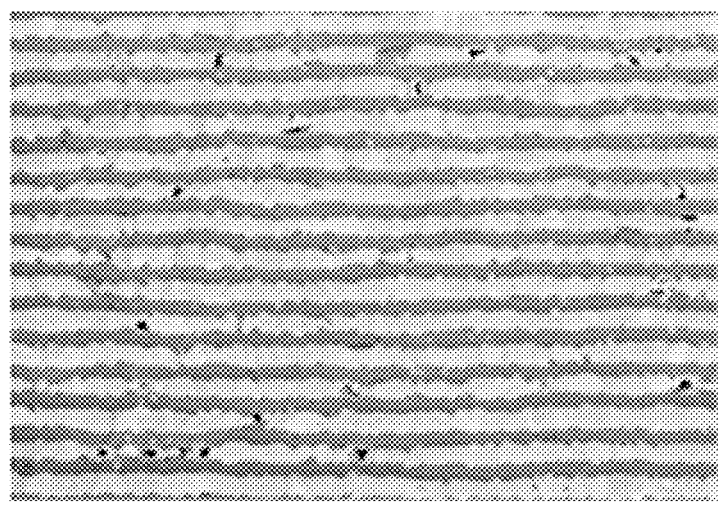
FIG. 4B is an SEM image showing a cross-section of an internal electrode formed of a conductive paste including nickel oxide according to an embodiment of the present invention.

Meanwhile, as shown in FIG. 4B, in the present embodiment, the internal electrodes are formed by adding nano-scale nickel oxide to the conductive paste for internal electrodes, instead of adding barium titanate thereto.

In this case, the internal electrodes may be shrinkage-controlled to be the same level as the case of adding barium titanate to the conductive paste for internal electrodes. In addition, since there is no phenomenon in the related art in which barium titanate is moved to the dielectric layer, the BDV may not be decreased to prevent reliability from being deteriorated.

As another method for solving the problem, in the case in which the nickel particle is added to the conductive paste for internal electrodes, two types of metal powder are additionally added to be alloyed, such that the shrinkage initiation temperature of the nickel alloy particle is moved to a high temperature.

However, in the case in which the internal electrodes are formed using the conductive paste for internal electrodes formed of the nickel alloy by adding two kinds of metals, the shrinkage initiation temperature of the nickel particle of the related art may be moved to a high temperature; however, the alloy component may react with the ceramic component of the dielectric layer during the sintering process to generate a disconnected portion in the internal electrodes, such that the connectivity of the internal electrodes may be deteriorated, and a dielectric rate of the dielectric layer may be deteriorated.

Meanwhile, in the present embodiment, the internal electrodes may be formed by using the nickel powder and nanoscale nickel oxide, instead of using the nickel alloy, in the conductive paste for internal electrodes.

In this case, the internal electrodes may be shrinkage-controlled to be the same level as the case of using the nickel alloy. In addition, since there is no phenomenon in which the alloy component reacts with the ceramic component of the dielectric layer during the sintering process, the connectivity of the internal electrodes and the dielectric rate of the dielectric layer may be prevented from being deteriorated.

As another method for solving the problem, the conductive paste is prepared using two kinds of nickel oxide having different average particle sizes, as a main component.

In this case, the nickel oxide is reduced under a reduction atmosphere to thereby have excellent metallic properties; however, since a content of nickel oxide is high, a change in volume generated in the reduction process may deteriorate a densification of the internal electrode.

Meanwhile, in the internal electrodes of the present embodiment, since nickel is used as a main component and nickel oxide is partially added as an additive, an excessive change in volume is not generated in the reduction process, thereby implementing internal electrodes having excellent densification after the sintering process.

Hereinafter, according to an embodiment of the present invention, a conductive paste for internal electrodes is prepared, and the prepared conductive paste is used to manufacture a multilayer ceramic capacitor.

The conductive paste for internal electrodes of the present embodiment was prepared as a mixture of a nickel powder having an average particle size of about 120 nm and a nickel oxide powder having an average particle size of about 20 nm. The nickel oxide powders were weighted to have contents of 1 part by weight, 3 parts by weight, 5 parts by weight, 7 parts by weight, 10 parts by weight, 11 parts by weight, 13 parts by weight, 15 parts by weight, 17 parts by weight, and 19 parts by weight, based on 100 parts by weight of the nickel powder, respectively.

Then, the conductive paste for internal electrodes was prepared by adding an ethyl cellulose-based binder, a terpineol solvent, or the like, to the mixture, and performing dispersive mixing with a three roll mill.

A conductive paste for internal electrodes of the Comparative Example was prepared by the same method as described above, except that a barium titanate powder is added thereto, instead of the nickel oxide powder.

Then, the prepared conductive paste for internal electrodes was dried and molded as pellets under the same pressure, by using a metal mold. Then, a thermal mechanical analysis (TMA) was performed to measure a shrinkage initiation temperature, connectivity of the internal electrode, whether or not delamination was generated, and whether or not a dielectric layer and the barium titanate powder were reacted with each other, for each content of added materials. Results thereof are shown in Table 1 below.

TABLE 1

| Sample | Added Material | Addition Amount (wt %/Ni) | Shrinkage Initiation Temperature (° C.) | Connectivity of Internal Electrode (%) | Generation of Delamination | Reactivity with Barium Titanate Present in Dielectric Layer |
|---|---|---|---|---|---|---|
| 1* | BaTiO$_3$ | 10 | 850 | 95.3 | NO | YES |
| 2 | NiO | 3 | 600 | 88.5 | YES | NO |
| 3 | NiO | 5 | 770 | 92.1 | NO | NO |
| 4 | NiO | 7 | 815 | 94.0 | NO | NO |
| 5 | NiO | 10 | 875 | 95.2 | NO | NO |
| 6 | NiO | 11 | 880 | 95.3 | NO | NO |
| 7 | NiO | 13 | 877 | 95.1 | NO | NO |
| 8 | NiO | 15 | 875 | 94.9 | NO | NO |
| 9 | NiO | 17 | 882 | 89.8 | YES | NO |
| 10 | NiO | 19 | 885 | 85.9 | YES | NO |

*indicates Comparative Example.

<Characteristics of Multilayer Ceramic Capacitors Manufactured by Using Conductive Paste Including Barium Titanate or Nickel Oxide>

The shrinkage initiation temperature may be defined as a temperature at which a shrinkage rate is 5%, and may be determined by the TMA.

The connectivity of the internal electrode may be defined as a ratio of "a real length of the entire electrode" to "an ideal length of the entire electrode", that is, "the connectivity of the electrode=a real length of the entire electrode/a length of the entire electrode".

The ideal length of the entire electrode may be calculated by multiplying the length of a single layer of the internal electrodes and the number of layers of the internal electrodes, and the real length of the entire electrode may be a length in a remaining portion excluding a disconnected portion of the electrode.

More specifically, the connectivity of the internal electrode may be calculated by counting the number of pixels, and calculating a relative ratio of the number of pixels, based on the high-powered microscope image of a cross-section perpendicular to a surface at which the internal electrodes are stacked.

If the connectivity of the internal electrode is high, the internal electrode is formed without voids and high capacitance may be secured therein, however, on the contrary, if the connectivity of the internal electrode is low, an effective surface of the internal electrode forming capacitance is decreased, and it may be difficult to form capacitance therein.

Delamination refers to a phenomenon in which the internal electrodes and the dielectric layers are separated from each other in the multilayer ceramic electronic component. In the case in which delamination is generated, electrical and mechanical characteristics of the multilayer ceramic electronic component may be deteriorated.

Reactivity between the internal electrode and the barium titanate of the dielectric layer refers to whether or not a material added to the internal electrode reacts with the barium titanate present in the dielectric layer. In the case in which the material added to the internal electrode reacts with barium titanate present in the dielectric layer, performance of the multilayer ceramic electronic component may be deteriorated.

In the Inventive Examples, a standard of the shrinkage initiation temperature was more than 700° C., generally having no problem in reliability. In addition, a standard of the connectivity of the internal electrode is 90% or more, which may generally secure appropriate capacitance.

Referring to Table 1, in Sample 1, the Comparative Example, 10 parts by weight of barium titanate were added to the conductive paste for internal electrodes, and the shrinkage initiation temperature was 850° C., higher than the standard of 700° C., and the connectivity of the internal electrode was 95.3%, higher than the standard of 90%. Delamination was not generated. However, there was a problem in that the barium titanate added to the internal electrode reacted with the barium titanate present in the dielectric layer.

In Sample 2, 3 parts by weight of nickel oxide were added to the conductive paste for internal electrodes, and the nickel oxide added to the electrode was not reacted with the barium titanate present in the dielectric layer. However, the shrinkage initiation temperature was 600° C., lower than the standard of 700° C., the connectivity of the internal electrode was 88.5%, lower than the standard of 90%, and delamination was generated.

In Samples 3 to 8, 5 parts by weight to 15 parts by weight of nickel oxides were added to the conductive paste for internal electrodes, respectively, the shrinkage initiation temperatures were 770° C., 815° C., 875° C., 880° C., 877° C., and 875° C., higher than the standard of 700° C., connectivities of the internal electrode were 92.1%, 94.0%, 95.2%, 95.3%, 95.1%, and 94.9%, higher than the standard of 90%, and delamination was not generated. In addition, the nickel oxide added to the electrode was not reacted with the barium titanate present in the dielectric layer.

In samples 9 and 10, 17 parts by weight and 19 parts by weight of nickel oxides were added to the conductive paste for internal electrodes, respectively, the shrinkage initiation temperatures were 882° C., and 885° C., higher than the standard of 700° C.; however, the connectivities of the internal electrode were 89.8% and 85.9%, lower than the standard of 90%, and delamination was generated.

Referring to FIG. 1, it may be appreciated that the shrinkage initiation temperature of the conductive paste for internal electrodes is increased until the amount of nickel oxide has a predetermined numerical value or more, and then the shrinkage initiation temperature is decreased at the predetermined numerical value.

The reason that the shrinkage initiation temperature is increased is as follows. As the temperature is increased, the nickel powder particles connected to each other are combined to be grown in order to decrease a specific surface area thereof. When the nickel particles grow, a nickel oxide is present between the nickel particles, such that a probability of direct contact between the nickel particles is decreased, as a result, the sintering initiation temperature is increased.

However, at the shrinkage initiation temperature according to an amount of nickel oxide, an excessive amount of nickel oxide components remains in a protrusion shape in a portion of the internal electrode after the sintering process. Therefore, in the case in which the content of nickel oxide is excessive, breakdown voltage (BDV) may be decreased, and as the content thereof is increased, a change in volume in the reduction process is increased to deteriorate the connectivity of the electrode, and accordingly, there is a need to limit the content thereof.

Therefore, when analyzing the shrinkage behavior, the connectivity of the internal electrode, and whether or not the delamination is generated, the desired added amount of nickel oxide may be 5.0 parts by weight to 15.0 parts by weight based on 100 parts by weight of nickel powder.

Hereinafter, a method of manufacturing a multilayer ceramic capacitor according to an embodiment of the present invention is described.

Firstly, a plurality of first and second ceramic sheets may be prepared.

A ceramic powder, a binder, a solvent, or the like, may be mixed to prepare a slurry, and the slurry may be used to manufacture the first and second ceramic sheets, having a μm level of thickness by a doctor blade method. However, a method of manufacturing the first and second ceramic sheets is not limited thereto.

Then, a conductive paste for internal electrodes may be applied to at least one surface of the first and second ceramic sheets by a screen printing method, a gravure printing method, or the like, to form first and second internal electrodes 131 and 132.

Here, the first and second internal electrodes 131 and 132 may be formed to be alternately exposed through both end surfaces of the first and second ceramic sheets.

In addition, the conductive paste for internal electrodes may be used by mixing a nickel powder, 5.0 parts by weight to 15.0 parts by weight of a nickel oxide powder based on 100 parts by weight of the nickel powder, and a small amount of an organic vehicle.

Then, the plurality of first and second ceramic sheets having the first and second internal electrodes 131 and 132 formed thereon are alternately stacked, pressurized in a lamination direction to compress the first and second ceramic sheets and the first and second internal electrodes 131 and 132 to each other, thereby manufacturing a ceramic laminate in which the first and second internal electrodes 131 and 132 are alternately stacked.

Next, the ceramic laminate is cut for each region corresponding to a single capacitor to be produced as a chip. Here, the ceramic laminate may be cut so that one ends of respective first and second internal electrodes 131 and 132 are alternately exposed through end surfaces of the ceramic laminate. Then, the chipped laminate may be fired at 1000° C. to 1200° C. to manufacture a ceramic body 110.

Then, first and second external electrodes 121 and 122 may be formed to be electrically connected to the first and second internal electrodes 131 and 132 exposed to both end surfaces of the ceramic body 110, while covering both end surfaces of the ceramic body 110, whereby a multilayer ceramic capacitor 100 may be manufactured. Then, plating treatment may be further performed by using nickel, tin, or the like, on surfaces of the first and second external electrodes 121 and 122.

As set forth above, according to embodiments of the present invention, a conductive paste for internal electrodes having a shrinkage initiation temperature (a temperature at which a shrinkage rate is 5% or more) of 700° C. or more is prepared by adding a nickel oxide thereto, and the prepared conductive paste for internal electrodes is used to manufacture a multilayer ceramic electronic component, whereby the generation of delamination and cracking may be suppressed to improve the reliability of a product.

In the case of a multilayer ceramic electronic component according to embodiments of the present invention, a shrinkage initiation temperature of an internal electrode is increased to improve a difference in stress between a ceramic sheet and the internal electrode, whereby an agglomeration or disconnection phenomenon of the internal electrode may be suppressed to improve the connectivity of the internal electrode. In addition, since a ceramic component of a dielectric layer and a component of the internal electrode may not react with each other to improve withstanding voltage characteristics and dielectric characteristics.

While the present invention has been shown and described in connection with the embodiments, it will be apparent to those skilled in the art that modifications and variations can be made without departing from the spirit and scope of the invention as defined by the appended claims.

What is claimed is:

1. A conductive paste for internal electrodes comprising:
    a nickel (Ni) powder;
    a nickel oxide (NiO) powder having a content of 5.0 to 15.0 parts by weight based on 100 parts by weight of the nickel powder; and
    an organic vehicle.

2. The conductive paste of claim 1, wherein the nickel powder has an average particle size of 80 nm to 200 nm.

3. The conductive paste of claim 1, wherein the nickel oxide powder has an average particle size of 10 nm to 50 nm.

4. The conductive paste of claim 1, wherein the organic vehicle includes an ethyl cellulose-based binder and terpineol.

5. A multilayer ceramic electronic component comprising:
    a ceramic body in which a plurality of dielectric layers are stacked; and
    a plurality of internal electrodes formed on at least one surfaces of the plurality of dielectric layers,
    wherein the plurality of internal electrodes are formed of a conductive paste including a nickel (Ni) powder, a nickel oxide (NiO) powder having a content of 5.0 to 15.0 parts by weight based on 100 parts by weight of the nickel powder, and an organic vehicle.

6. The multilayer ceramic electronic component of claim 5, wherein the nickel powder has an average particle size of 80 nm to 200 nm.

7. The multilayer ceramic electronic component of claim 5, wherein the nickel oxide powder has an average particle size of 10 nm to 50 nm.

8. The multilayer ceramic electronic component of claim 5, wherein the organic vehicle includes an ethyl cellulose-based binder and terpineol.

9. The multilayer ceramic electronic component of claim 5, wherein a shrinkage initiation temperature of the internal electrodes is lower than that of the ceramic body,
    the shrinkage initiation temperature is 700° C. or above.

10. The multilayer ceramic electronic component of claim 5, further comprising external electrodes formed on both end surfaces of the ceramic body and electrically connected to the internal electrodes.

11. A method of manufacturing a multilayer ceramic electronic component, the method comprising:
    forming first and second internal electrodes by applying a conductive paste including a nickel (Ni) powder, a nickel oxide (NiO) powder having a content of 5.0 to 15.0 parts by weight based on 100 parts by weight of the nickel powder, and an organic vehicle to at least one surfaces of first and second ceramic sheets, so as to be exposed through both end surfaces of the first and second ceramic sheets, respectively;
    forming a laminate by alternately stacking the plurality of first and second ceramic sheets having the first and second internal electrodes formed thereon;
    forming a ceramic body by sintering the laminate; and
    forming first and second external electrodes on both end surfaces of the ceramic body so as to cover surfaces on which the first and second internal electrodes are exposed.

12. The method of claim 11, wherein in the forming of the first and second internal electrodes, the first and second internal electrodes are alternately exposed through both end surfaces of the laminate when the first and second ceramic sheets are alternately stacked.

* * * * *